(12) United States Patent
Kin et al.

(10) Patent No.: US 10,930,539 B2
(45) Date of Patent: Feb. 23, 2021

(54) ELECTROSTATIC CHUCK HEATER

(71) Applicant: NGK INSULATORS, LTD., Nagoya (JP)

(72) Inventors: Rishun Kin, Handa (JP); Hiroshi Takebayashi, Handa (JP); Natsuki Hirata, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 550 days.

(21) Appl. No.: 15/791,973

(22) Filed: Oct. 24, 2017

(65) Prior Publication Data

US 2018/0047606 A1 Feb. 15, 2018

Related U.S. Application Data

(63) Continuation of application No. PCT/JP2017/012345, filed on Mar. 27, 2017.

(60) Provisional application No. 62/314,564, filed on Mar. 29, 2016.

(51) Int. Cl.
*H01L 21/683* (2006.01)
*H01L 21/67* (2006.01)
*H05B 3/26* (2006.01)

(52) U.S. Cl.
CPC .... *H01L 21/6833* (2013.01); *H01L 21/67103* (2013.01); *H01L 21/6831* (2013.01); *H05B 3/26* (2013.01)

(58) Field of Classification Search
CPC ........... H01L 21/67103; H01L 21/6831; H01L 21/6833; H05B 3/26
USPC ...... 219/444, 443.1, 444.1, 468.1, 544, 546, 219/548, 552, 553, 56.1, 201, 451.1, 219/465.1, 466.1, 528.538, 542; 118/724, 118/725, 728; 361/234, 772, 773, 777,
(Continued)

(56) References Cited

U.S. PATENT DOCUMENTS 4,827,611 A * 5/1989 Pai ..................... H01L 23/49811
257/E23.068
5,822,171 A * 10/1998 Shamouilian ..... C23C 16/45521
361/234
(Continued)

FOREIGN PATENT DOCUMENTS

CN 1513107 A 7/2004
DE 19915146 C1 * 7/2000 ......... H01L 21/2885
(Continued)

OTHER PUBLICATIONS

Aisler (Aisler B.V. 2019, under section: Design Rules & Specification, see attached PCB Design Rules.pdf) [accessed on Feb. 27, 2019 at: //aisler.net/help/design-rules-and-specifications/2-and-4-layer-design-rules] (Year: 2019).*
(Continued)

*Primary Examiner* — Dana Ross
*Assistant Examiner* — Ket D Dang
(74) *Attorney, Agent, or Firm* — Burr & Brown, PLLC

(57) ABSTRACT

An electrostatic chuck heater is such that a sheet heater formed by embedding a heater wire in a resin sheet is disposed between an electrostatic chuck and a support pedestal. The heater wires are provided one for each of many zones of the resin sheet, and are composed of copper wires routed unicursally from their first ends to their second ends so as to extend throughout the zones.

5 Claims, 4 Drawing Sheets

(58) Field of Classification Search
USPC ........ 361/400, 405, 421; 257/784, 734, 693, 257/786; 29/842, 843, 854, 884
See application file for complete search history.

(56) References Cited

U.S. PATENT DOCUMENTS

| | | | | |
|---|---|---|---|---|
| 6,653,742 | B1* | 11/2003 | Lin | H01L 24/11 156/292 |
| 2002/0186967 | A1* | 12/2002 | Ramanan | H01L 21/67103 392/418 |
| 2003/0052118 | A1 | 3/2003 | Ramanan et al. | |
| 2003/0075537 | A1* | 4/2003 | Okajima | H01L 21/67103 219/444.1 |
| 2005/0167422 | A1* | 8/2005 | Kachi | H01L 21/67103 219/548 |
| 2007/0235887 | A1* | 10/2007 | Kaimori | H01L 24/85 257/784 |
| 2009/0154126 | A1* | 6/2009 | Shimoishizaka | H01L 23/49838 361/772 |
| 2010/0182036 | A1* | 7/2010 | Regan | H01L 21/67265 324/764.01 |
| 2011/0003520 | A1* | 1/2011 | Kitagawa | C25D 5/10 439/887 |
| 2011/0089549 | A1* | 4/2011 | Zenbutsu | H01L 21/565 257/676 |
| 2013/0072035 | A1* | 3/2013 | Gaff | H01L 21/6831 438/798 |
| 2013/0270250 | A1* | 10/2013 | Pease | H01L 21/67103 219/443.1 |
| 2014/0091077 | A1* | 4/2014 | Kong | H01L 21/67103 219/444.1 |
| 2015/0022936 | A1* | 1/2015 | Cox | H05K 3/285 361/234 |
| 2015/0223318 | A1* | 8/2015 | Sakamoto | H05K 1/0206 361/717 |
| 2015/0364355 | A1* | 12/2015 | Kuchimachi | H01L 21/67103 156/345.52 |
| 2016/0027678 | A1* | 1/2016 | Parkhe | H01L 21/6831 279/128 |

FOREIGN PATENT DOCUMENTS

| | | |
|---|---|---|
| JP | 2000-150119 A1 | 5/2000 |
| JP | 2004-022476 A1 | 1/2004 |
| JP | 2004-533098 A1 | 10/2004 |
| JP | 2005-159018 A1 | 6/2005 |
| JP | 2010-040644 A1 | 2/2010 |
| WO | 2015/119734 A1 | 8/2015 |
| WO | WO 2015153756 A1 * | 10/2015 |

OTHER PUBLICATIONS

International Search Report and Written Opinion (Application No. PCT/JP2017/012345) dated May 9, 2017.
English translation of International Preliminary Report on Patentability (Chapter I) (Application No. PCT/JP2017/012345) dated Oct. 11, 2018.
Korean Office Action (Application No. 10-2017-7031235) dated Mar. 11, 2019 (with English translation).
Chinese Office Action (Application No. 201780001379.X) dated Jan. 20, 2020 (with English translation).
Taiwanese Office Action (Application No. 106110270) dated Oct. 26, 2020.

* cited by examiner

ELECTROSTATIC CHUCK HEATER

The present application claims priority from U.S. Provisional Application No. 62/314,564, filed on Mar. 29, 2016, the entire contents of which are incorporated herein by reference.

BACKGROUND OF THE INVENTION

1. Field of the Invention

The present invention relates to an electrostatic chuck heater.

2. Description of the Related Art

As an electrostatic chuck heater, there has been known one in which a sheet heater formed by embedding a heating member in a resin sheet is provided between an electrostatic chuck and a base (see PTL 1). In such an electrostatic chuck heater, the resin sheet functions as a buffer layer that reduces rapid expansion or contraction of the electrostatic chuck, and a crack or the like can be prevented from occurring in the electrostatic chuck.

CITATION LIST

Patent Literature

PTL 1: JP 2010-40644

SUMMARY OF THE INVENTION

However, in PTL 1, the heating member is formed of a material having a relatively high resistance such as titanium, tungsten, or molybdenum, and therefore there is a problem in that when the heating member is densely routed, the temperature increases excessively. Therefore, the routing spacing of the heating member needs to be increased. However, doing so causes a problem in that the temperature difference between a part where the heating member exists and a part where the heating member does not exist increases, and the thermal uniformity is impaired.

The present invention has been made to solve the above-described problem, and it is a main object of the present invention to improve the thermal uniformity of a wafer as compared to a conventional electrostatic chuck heater.

The electrostatic chuck heater of the present invention is one in which a sheet heater formed by embedding heater wires in a resin sheet is disposed between an electrostatic chuck and a support pedestal. The heater wires are provided one for each of many zones of the resin sheet, and each of the heater wires is composed of copper wire routed unicursally from one end to the other end so as to extend throughout the zone.

In this electrostatic chuck heater, the heater wires provided one for each of many zones of the resin sheet are composed of copper wires. Copper has a low electrical resistance compared to titanium, tungsten, molybdenum, and so forth. Therefore, even if the heater wires are densely routed, the temperature does not increase excessively, and the routing spacing can be reduced. As a result, on the wafer placing surface of the electrostatic chuck, the temperature difference between a part where the heater wire exists and a part where the heater wire does not exist decreases, and the thermal uniformity of the wafer is improved.

The electrostatic chuck may be formed by embedding an electrostatic electrode in a ceramic sintered body. The support pedestal may be made of metal and may have a coolant channel therein.

In the electrostatic chuck heater of the present invention, the heater wires may be routed at a density of 50 or less wires per 1 mm of width. By doing so, the routing spacing of the heater wires can be made sufficiently small, and the thermal uniformity of the wafer is improved. Although one or more heater wires may be routed per 1 mm of width, five or more heater wires are preferably routed.

In the electrostatic chuck heater of the present invention, the thickness of the heater wires may be set to 35 µm or less. By doing so, the resin sheet can be made thin, and therefore the thermal resistance between the electrostatic chuck and the support pedestal can be reduced. The lower limit of the thickness of the heater wires is not particularly limited, but may be a manufacturing limit value (for example, 4 µm).

In the electrostatic chuck heater of the present invention, the sheet heater may have a first electrode area and a second electrode area that are parallel to the surface of the sheet heater and differ in height, the first electrode area may be an area in which the heater wires are provided, the second electrode area may be an area in which a plurality of jumper wires are provided that supply power to the heater wires, and the jumper wires may be composed of copper wires. By doing so, power supplied to each heater electrode can be individually controlled, and therefore high thermal uniformity is easily achieved. Since the jumper wires are composed of copper wires having a low electrical resistance (specific electrical resistance), they are less likely to generate heat even when they have a small cross-sectional area. Therefore, the jumper wires can be laid out at high density. For example, the jumper wires may be routed at a density of 9 or more copper wires per 10 mm of width. The jumper wires may be routed at a density of 20 or less copper wires per 10 mm of width.

In the electrostatic chuck heater of the present invention, the copper wires may have a variation in wire width (the wire width of the widest part minus the wire width of the narrowest part) of 4 µm or less. When the shape of the copper wires is formed by wet etching, the variation in wire width of the copper wires can be kept to 4 µm or less. By doing so, even if the design value of the inter-wire distance is set to ten to several tens µm, adjacent wires do not come into contact with each other when copper wires are actually formed.

In the electrostatic chuck heater of the present invention, the copper wires preferably have a purity of 99.9% by mass or more. In general, the higher the purity of copper, the lower the electrical resistance, and therefore such copper wires are suitable as the heater wires or the jumper wires of the electrostatic chuck heater of the present invention.

DETAILED DESCRIPTION OF THE INVENTION

Figure 1:
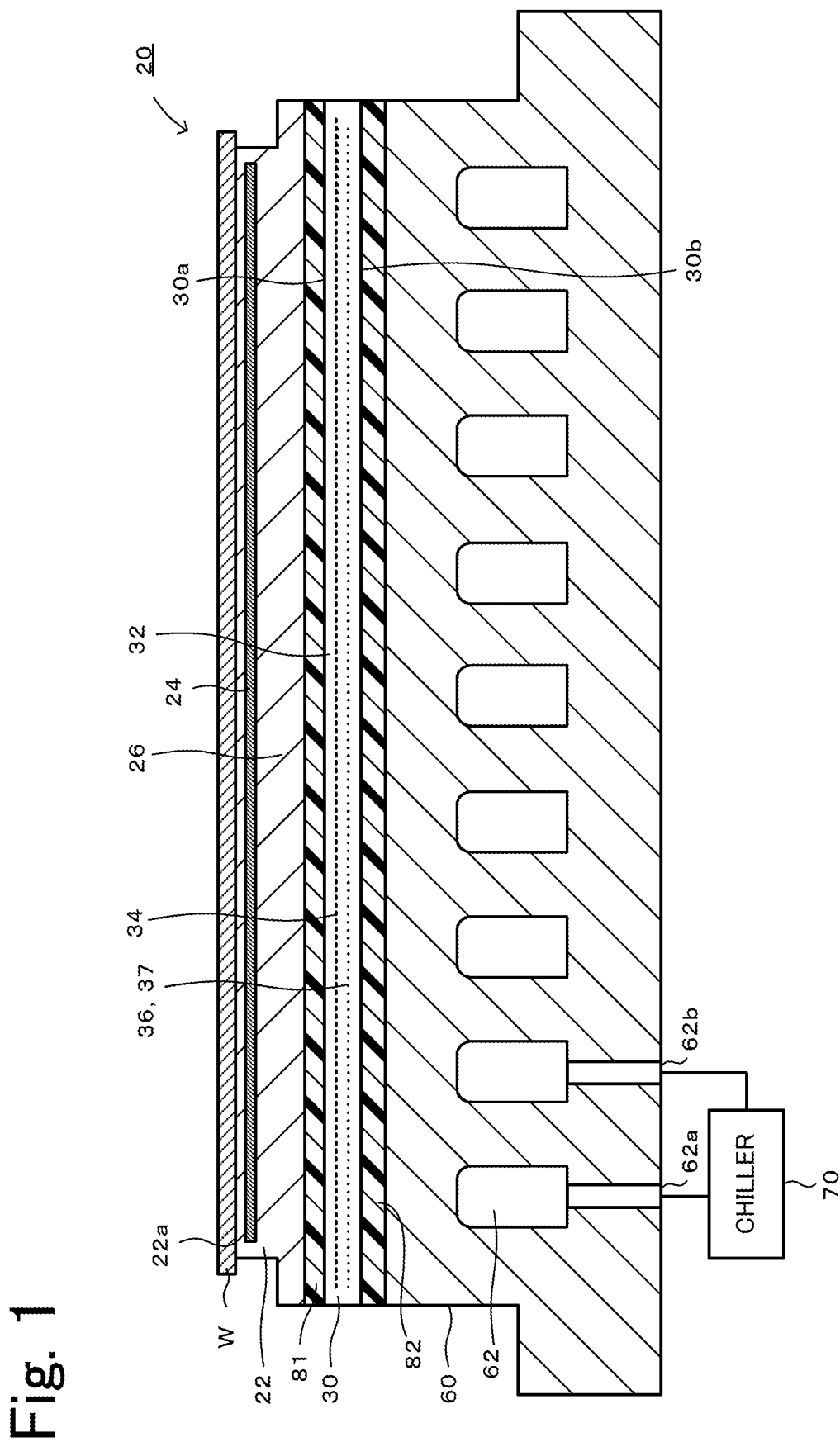
FIG. 1 is a sectional view showing the schematic configuration of an electrostatic chuck heater 20.
Figure 2:
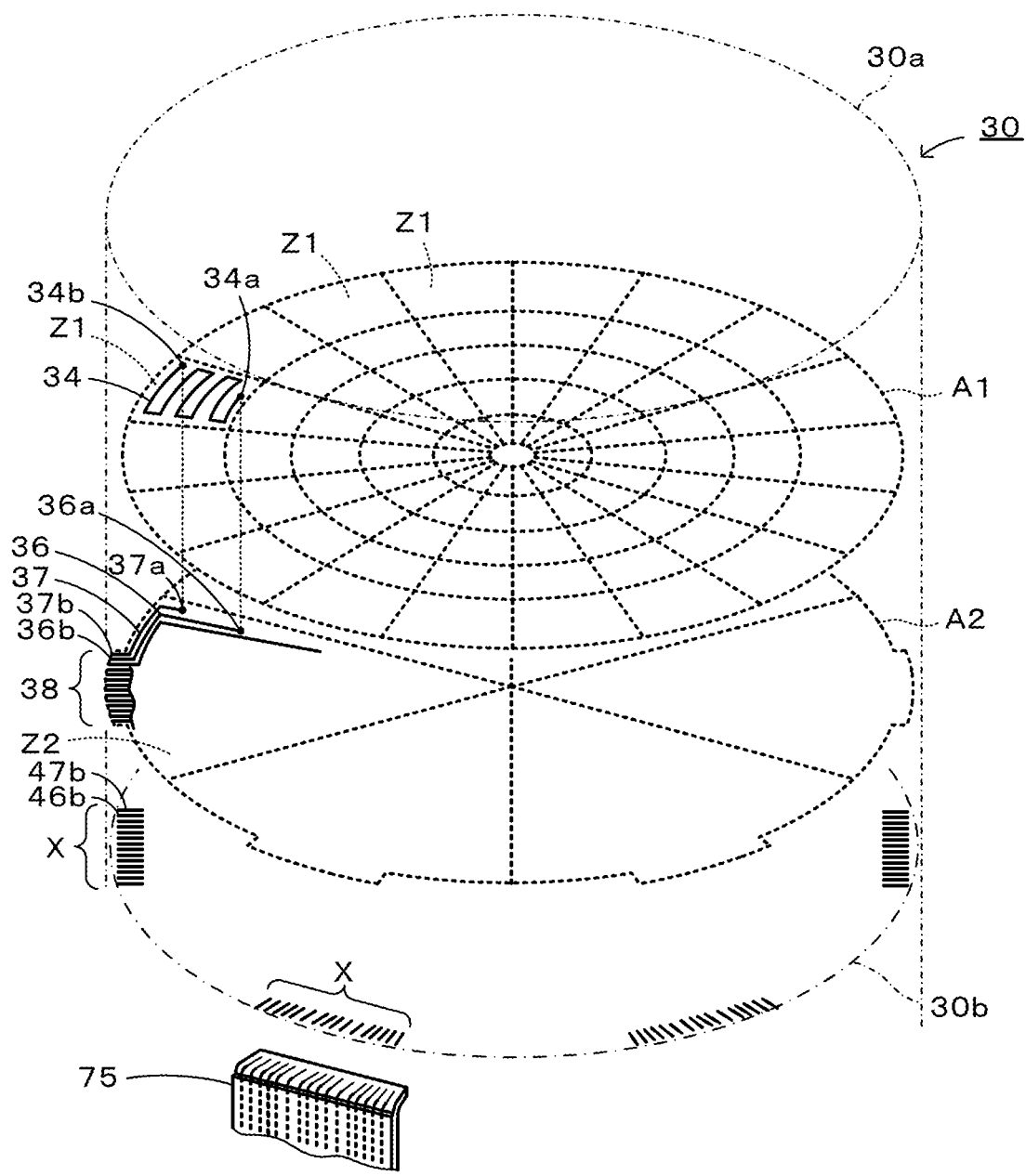
FIG. 2 is a perspective view showing the internal structure of a sheet heater 30.
Figure 3:
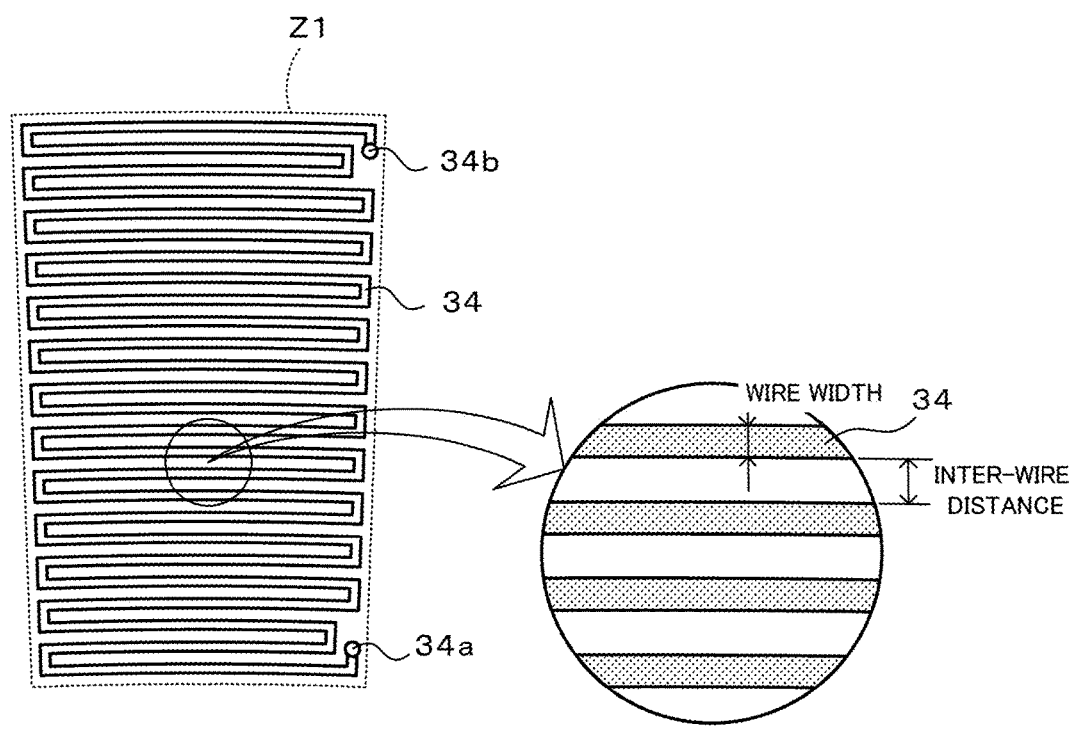
FIG. 3 is a plan view of a heater wire 34 provided in a zone Z1.

A preferred embodiment of the present invention will be described below with reference to the drawings. FIG. 1 is a sectional view showing the schematic configuration of an electrostatic chuck heater 20, FIG. 2 is a perspective view showing the internal structure of a sheet heater 30, and FIG. 3 is a plan view of a heater wire 34 provided in a zone Z1.

The electrostatic chuck heater 20 is a device that attracts and holds a wafer W on a wafer placing surface 22a. The electrostatic chuck heater 20 includes an electrostatic chuck 22, a sheet heater 30, and a support pedestal 60. The lower surface of the electrostatic chuck 22 and the upper surface 30a of the sheet heater 30 are bonded to each other with a first bonding sheet 81 therebetween. The upper surface of the support pedestal 60 and the lower surface 30b of the sheet heater 30 are bonded to each other with a second bonding sheet 82 therebetween. Examples of the bonding sheets 81 and 82 include a sheet having acrylic resin layers on both sides of a core material made of polypropylene, a sheet having silicone resin layers on both sides of a core material made of polyimide, and a sheet made only of epoxy resin.

The electrostatic chuck 22 is a disk-shaped member, and is formed by embedding an electrostatic electrode 24 in a ceramic sintered body 26. Examples of the ceramic sintered body 26 include aluminum nitride sintered body and alumina sintered body. The upper surface of the electrostatic chuck 22 is a wafer placing surface 22a on which a wafer W is placed. The thickness of the ceramic sintered body 26 is not particularly limited, but is preferably 0.5 to 4 mm.

The sheet heater 30 is a disk-shaped member, and is formed by building heater wires 34 and jumper wires 36 and 37 in a heat-resistant resin sheet 32. Examples of the material of the resin sheet 32 include polyimide resin and liquid crystal polymer. The sheet heater 30 has a first electrode area A1 and a second electrode area A2 (see FIG. 2) that are parallel to the upper surface 30a of the sheet heater 30 and differ in height.

The first electrode area A1 is divided into many zones Z1 (for example, 100 zones or 300 zones). In each zone Z1, a heater wire 34 composed of a copper wire is routed in a zigzag manner and unicursally from a first end 34a to a second end 34b so as to extend throughout the zone Z1. In FIG. 2, virtual lines shown as dotted lines are drawn in the first electrode area A1, and parts surrounded by the virtual lines are zones Z1. Although, in FIG. 2, for the sake of convenience, a heater wire 34 is shown only in one zone Z1, similar heater wires 34 are provided also in the other zones Z1. The outline of the sheet heater 30 is shown by alternate long and short dash line.

FIG. 3 is a plan view of a heater wire 34 provided in one zone Z1. The heater wire 34 is composed of a copper wire having a high purity (99.9% by mass or more), and it is preferable that 50 or less wires be routed per 1 mm of width. Although one or more heater wires 34 may be routed per 1 mm of width, five or more heater wires 34 may be routed. The wire width of the heater wire 34 may be 10 m or more (preferably 20 to 80 µm, and more preferably 40 to 60 µm), and the inter-wire distance may be 10 µm or more (preferably 20 to 80 µm, and more preferably 40 to 60 µm). When the wire width of the heater wire 34 is 10 µm, and the inter-wire distance is 10 µm, 50 heater wires 34 can be routed per 1 mm of width. When the wire width of the heater wire 34 is 50 µm, and the inter-wire distance is 50 µm, 10 heater wires 34 can be routed per 1 mm of width. When the wire width of the heater wire 34 is 100 µm, and the inter-wire distance is 100 µm, 5 heater wires 34 can be routed per 1 mm of width. The thickness of the heater wire 34 may be 35 µm or less. The lower limit of the thickness of the heater wire 34 is not particularly limited, but may be a manufacturing limit value (for example, 4 µm). The variation in wire width (the wire width of the widest part minus the wire width of the narrowest part) of the heater wire 34 may be kept to 4 µm or less. When the shape of the heater wire 34 is formed by wet etching, the variation in wire width can be kept to 4 µm or less.

In the second electrode area A2, as shown in FIG. 2, jumper wires 36 for power supply (positive electrode side) composed of copper wires connected to first ends 34a of the heater wires 34, and jumper wires 37 for grounding (negative electrode side) composed of copper wires connected to second ends 34b of the heater wires 34 are provided. Therefore, both the number of the jumper wires 36 and the number of the jumper wires 37 coincide with the number of the heater wires 34. The second electrode area A2 is divided into zones Z2 the number of which is smaller than the number of the zones Z1 (for example, six or eight). In FIG. 2, virtual lines shown as dotted lines are drawn in the second electrode area A2, and parts surrounded by the virtual lines are zones Z2. Although, in FIG. 2, for the sake of convenience, (some of) the jumper wires 36 and 37 are shown only in one zone Z2, similar jumper wires 36 and 37 are provided also in the other zones Z2. This embodiment will be described under the assumption that a plurality of heater wires 34 within a projection area when one zone Z2 is projected onto the first electrode area A1 belong to the same group. First ends 34a of heater wires 34 belonging to one group are connected to first ends 36a of jumper wires 36 in a zone Z2 corresponding to that group, through vias (not shown) vertically penetrating between the first electrode area A1 and the second electrode area A2. Second ends 36b of those jumper wires 36 are pulled out to an outer peripheral area 38 provided in that zone Z2. Second ends 34b of those heater wires 34 are connected to first ends 37a of jumper wires 37 in the same zone Z2, through vias (not shown) vertically penetrating between the first electrode area A1 and the second electrode area A2. Second ends 37b of those jumper wires 37 are pulled out to the outer peripheral area 38 provided in that zone Z2. As a result, second ends 36b and 37b of jumper wires 36 and 37 connected to heater wires 34 belonging to the same group are collectively disposed in one outer peripheral area 38. In an area X when that outer peripheral area 38 is projected onto the lower surface 30b of the sheet heater 30, jumper lands 46b and 47b connected to the second ends 36b and 37b of the jumper wires 36 and 37 through vias (not shown) are disposed side by side. These jumper lands 46b and 47b are also made of copper.

The jumper wires 36 may be routed at a density of 9 or more (preferably 9 or more but 20 or less) copper wires per 10 mm of width. The thickness of the jumper wires 36 may be 35 µm or less. The lower limit of the thickness of the jumper wires 36 is not particularly limited, and may be a manufacturing limit value (for example, 4 µm). The variation in wire width of the jumper wires 36 may be kept to 4 µm or less. When the shape of the jumper wires 36 is formed by wet etching, the variation in wire width can be kept within a range of 4 m or less. The routing density, thickness, formation method, and so forth of the jumper wires 37 are similar to those of the jumper wires 36.

As shown in FIG. 1, the support pedestal 60 is a disk-shaped member made of metal such as aluminum or aluminum alloy, and a coolant channel 62 is provided therein. A chiller 70 that adjusts the temperature of coolant is connected to the entrance 62a and the exit 62b of the coolant channel 62. The coolant is supplied from the chiller 70 to the entrance 62a of the coolant channel 62, passes through the coolant channel 62 provided so as to extend throughout the support pedestal 60, is returned to the chiller 70 through the exit 62b of the coolant channel 62, is cooled to a set temperature in the chiller 70, and is then supplied to the entrance 62a of the coolant channel 62 again. The support pedestal 60 further includes through-holes (not shown) for moving up and down lift pins that lift up the wafer W.

The electrostatic electrode 24 is supplied with power from a DC power supply through a feeding rod (not shown). As shown in FIG. 2, the heater wires 34 are supplied with power through a flexible printed circuit board for connection (FPC for connection) 75 connected to the jumper lands 46b and 47b. The FPC for connection 75 is a cable formed by bundling metal conductors coated with resin films into a strip.

Next, an application example of the thus configured electrostatic chuck heater 20 will be described. The electrostatic chuck heater 20 is placed in a vacuum chamber (not shown), and a wafer W is placed on the wafer placing surface 22a of the electrostatic chuck 22. The inside of the vacuum chamber is depressurized by a vacuum pump, and is adjusted at a predetermined degree of vacuum, a DC voltage is applied to the electrostatic electrode 24 of the electrostatic chuck 22 to generate the Coulomb force or the Johnson-Rahbek force, and the wafer W is attracted and fixed to the wafer placing surface 22a of the electrostatic chuck 22. Next, the inside of the vacuum chamber is set to a process gas atmosphere at a predetermined pressure (for example, several tens to several hundred Pa). In this state, plasma is generated and the surface of the wafer W is etched. In the meantime, a controller (not shown) performs control such that the wafer W reaches a predetermined target temperature. Specifically, the controller inputs a detection signal from a temperature measuring sensor (not shown) that measures the temperature of the wafer W, and controls the current supplied to the heater wires 34 and the temperature of coolant circulated through the coolant channel 62 such that the measured temperature of the wafer W matches the target temperature. In particular, the controller finely controls the current supplied to the heater wires 34 so that temperature distribution of the wafer W does not occur. The temperature measuring sensor may be embedded in the resin sheet 32, or may be bonded to the surface of the resin sheet 32. In the electrostatic chuck heater 20, since the temperature can be finely controlled for each zone with many heater wires 34, highly accurate thermal uniformity can be achieved.

Next, an example of a method for manufacturing the electrostatic chuck 22 will be described. First, a disk member of a compacted or sintered body of ceramic is prepared, and an electrostatic electrode 24 is formed on one surface thereof. The electrostatic electrode 24 may be formed by screen-printing electrode paste, PVD, CVD, plating, or the like. Next, another disk-shaped compacted body having the same diameter as the disk member is laminated on a surface of the disk member on which the electrostatic electrode 24 is formed, and a laminated body is thereby formed. This laminated body is hot-press fired, and a ceramic sintered body 26 in which the electrostatic electrode 24 is embedded is obtained. The ceramic sintered body 26 is adjusted to the desired shape and thickness by processing such as grinding or blasting. An electrostatic chuck 22 is thereby obtained.

An example of a method for manufacturing the sheet heater 30 will be described. First, a first resin layer forming a layer between the upper surface 30a of the sheet heater 30 and the first electrode area A1 is prepared, and heater wires 34 are formed on the surface of the first resin layer by known photolithography. Next, a second resin layer is laminated so as to cover the heater wires 34, and jumper wires 36 and 37 are formed on the surface of the second resin layer by known photolithography. At this time, vias that electrically connecting the heater wires 34 and the jumper wires 36 and 37 are also provided so as to vertically penetrate through the second resin layer. Next, a third resin layer is laminated so as to cover the jumper wires 36 and 37, and jumper lands 46b and 47b are formed on the surface of the third resin layer by known photolithography. At this time, vias that electrically connecting the jumper wires 36 and 37 and the jumper lands 46b and 47b are also provided so as to vertically penetrate through the third resin layer. A sheet heater 30 is thereby obtained. The first to third resin layers may be formed, for example, of polyimide resin or liquid crystal polymer.

Figure 4A:
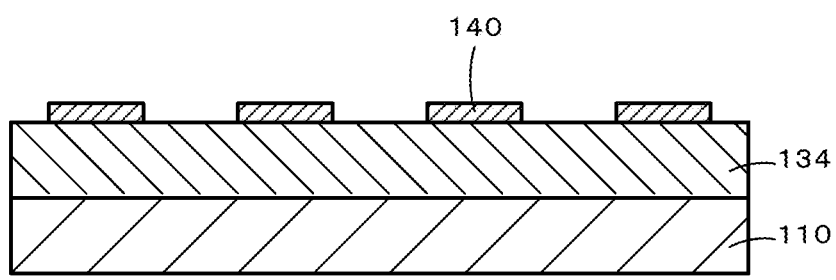
FIGS. 4A to 4C include manufacturing step diagrams of a heater wire 34.
Figure 4B:
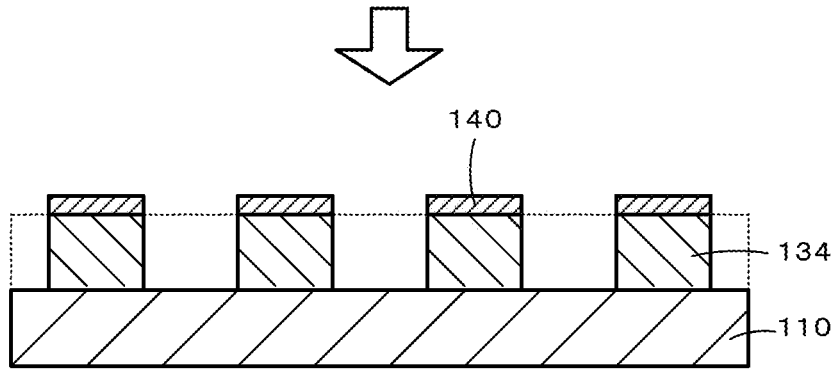
Figure 4C:
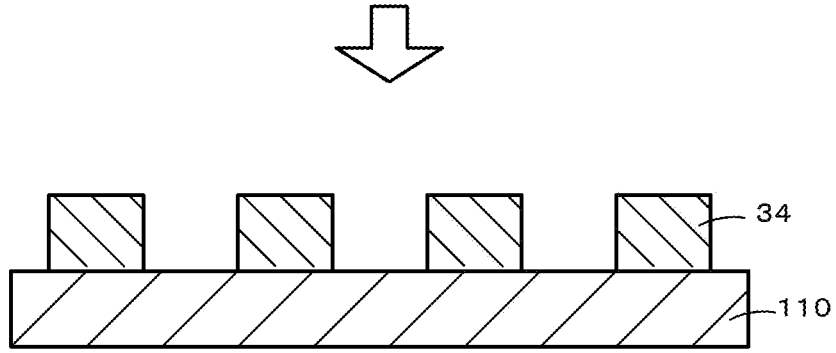

An example of manufacturing the heater wires 34 will be described below with reference to FIGS. 4A to 4C. First, a copper foil 134 is pasted on the entire upper surface of a resin layer 110, a resist layer 140 is formed on the entire upper surface of the copper foil 134, a mask is placed over the resist layer 140, and a pattern is formed such that the same shape as the shape of the heater wire 34 (see FIG. 3) remains (see FIG. 4A). The copper foil 134 may be formed by vacuum deposition, sputtering, or the like. Next, by wet etching, part of the copper foil 134 that is not masked by the resist layer 140 is corroded and dissolved in etchant (see FIG. 4B). Finally, the resist layer 140 is removed with stripping liquid to complete the heater wire 34 (see FIG. 4C). The variation in wire width (the wire width of the widest part minus the wire width of the narrowest part) of heater wires 34 formed by wet etching was measured. The design value of wire width was set to 50 μm, 100 μm, 1000 μm, 2000 μm. The results are shown in Table 1. In the case of each design value, the variation in wire width was 4 μm or less. For comparison, the variation in wire width of heater wires formed by printing conventional tungsten-based metal paste was measured. As shown in Table 1, the variation in wire width was about 60 μm. However, when the design value is set to 50 μm, a heater wire was not able to be manufactured. The variation in wire width of the jumper wires 36 can also be kept to 4 μm or less by forming them by wet etching.

TABLE 1

| Design value of wire width of a heater wire (μm) | Wire width of a heater wire formed by CU wet etching (μm) | | | | Wire width of a heater wire formed by printing tungsten-based metal paste (μm) | | | |
|---|---|---|---|---|---|---|---|---|
| | Max | Min | Variation | Average | Max | Min | Variation | Average |
| 50 | 52.3 | 48.7 | 3.6 | 50.4 | Manufacuturing unavailable | | | |
| 100 | 102.4 | 98.6 | 3.8 | 100.8 | 131.8 | 72.4 | 59.4 | 102.8 |
| 1000 | 1002.2 | 998.3 | 3.9 | 1000.5 | 1032.3 | 971.4 | 60.9 | 1002.5 |
| 2000 | 2001.9 | 1997.9 | 4.0 | 2000.3 | 2033.1 | 1973.4 | 59.7 | 2003.9 |

In the above-described electrostatic chuck heater 20, the heater wires 34 embedded one in each zone Z1 of the resin sheet 32 are composed of copper wires. Copper has a low electrical resistance compared to titanium, tungsten, molybdenum, and so forth. Therefore, even if the heater wires 34 are densely routed, the temperature does not increase excessively, and the inter-wire distance (routing spacing) can be reduced. As a result, on the wafer placing surface 22a of the electrostatic chuck 22, the temperature difference between a part where the heater wire 34 exists and a part where the heater wire 34 does not exist decreases, and the thermal uniformity of the wafer W is improved.

When 50 or less heater wires 34 are routed per 1 mm of width, the routing spacing of the heater wires 34 can be made sufficiently small, and therefore the thermal uniformity of the wafer W is improved.

In addition, when the thickness of the heater wires 34 is set to 35 m or less, the resin sheet 32 can be made thin, and therefore the thermal resistance between the electrostatic chuck 22 and the support pedestal 60 can be reduced.

Moreover, since the jumper wires 36 and 37 are also composed of copper wires having a low electrical resistance (specific electrical resistance), they are less likely to generate heat even when they have a small cross-sectional area. Therefore, the jumper wires 36 and 37 can be laid out at high density. For example, the jumper wires 36 and 37 may be routed at a density of 9 or more copper wires per 10 mm of width. The jumper wires 36 and 37 may be routed at a density of 20 or less copper wires per 10 mm of width.

Since both the heater wires 34 and the jumper wires 36 and 37 have a variation in wire width of 4 µm or less, even if the design value of the inter-wire distance is set to ten to several tens µm, adjacent wires do not come into contact with each other when copper wires are actually formed.

Further, copper wires that make up the heater wires 34 and the jumper wires 36 and 37 have a purity of 99.9% by mass or more. In general, the higher the purity of copper, the lower the electrical resistance, and therefore such copper wires are suitable as the heater wires 34 and the jumper wires 36 and 37 of the electrostatic chuck heater 20.

It goes without saying that the present invention is not limited to the embodiment described above and can be implemented in various embodiments without departing from the technical scope of the present invention.

For example, although, in the above-described embodiment, the heater wires 34 are formed in a zig-zag manner, the shape of the heater wires 34 is not particularly limited to this shape, and the heater wires 34 may have any shape as long as it can be drawn unicursally.

Although, in the above-described embodiment, the sheet heater 30 has a structure in which a resin layer is provided over the heater wires 34, this resin layer may be omitted so that the heater wires 34 are exposed on the upper surface 30a of the sheet heater 30. In this case, the first bonding sheet 81 is disposed so as to cover the heater wires 34.

Although, in the above-described embodiment, both the jumper wires 36 for power supply and the jumper wires 37 for grounding are provided in the same second electrode area A2, it is possible that a third electrode area A3 is provided between the second electrode area A2 and the lower surface 30b of the sheet heater 30 so as to be parallel to the first and second electrode areas A1 and A2, one is provided in the second electrode area A2, and the other is provided in the third electrode area A3.

Although, in the above-described embodiment, the first and second electrode areas A1 and A2 are each a single layer, at least one of the first and second electrode areas A1 and A2 may have a multi-layer (multi-tier) structure.

What is claimed is:

1. An electrostatic chuck heater in which a sheet heater formed by embedding heater wires in a resin sheet is disposed between an electrostatic chuck and a support pedestal,
   wherein the heater wires are provided one for each of many zones of the resin sheet, and each of the heater wires is composed of copper wire routed unicursally from one end to an other end so as to extend throughout the zone,
   wherein the sheet heater has a first electrode area and a second electrode area that are parallel to a surface of the sheet heater and differ in height, the first electrode area is an area in which the heater wires are provided, the second electrode area is an area in which a plurality of jumper wires are provided that supply power to the heater wires, and the jumper wires are composed of copper wires,
   wherein the jumper wires are routed at a density of 9 or more of the copper wires per 10 mm of width, and
   wherein the first electrode area has heater zones, which correspond to the heater wires respectively, the second electrode area has one or more jumper zones and a number of the one, or more jumper zones is smaller than a number of the heater zones, ends of the jumper wires, which are connected to the heater wires within a projection area when the one or more jumper zones are projected onto the first electrode area, are collectively disposed in an outer peripheral area provided in the one or more jumper zones.

2. The electrostatic chuck heater according to claim 1, wherein the heater wires are routed at a density of 50 or less wires per 1 mm of width.

3. The electrostatic chuck heater according to claim 1, wherein a thickness of the heater wires is 35 µm or less.

4. The electrostatic chuck heater according to claim 1, wherein the copper wires have a variation that is the wire width of a widest part minus the wire width of a narrowest part of 4 µm or less.

5. The electrostatic chuck heater according to claim 1, wherein the copper wires have a purity of 99.9% by mass or more.

* * * * *